(12) United States Patent
Gonya

(10) Patent No.: US 6,410,857 B1
(45) Date of Patent: Jun. 25, 2002

(54) SIGNAL CROSS-OVER INTERCONNECT FOR A DOUBLE-SIDED CIRCUIT CARD ASSEMBLY

(75) Inventor: Stephen G. Gonya, Endicott, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/927,643

(22) Filed: Aug. 13, 2001

Related U.S. Application Data
(60) Provisional application No. 60/272,571, filed on Mar. 1, 2001.

(51) Int. Cl.[7] .................................................. H05K 1/00
(52) U.S. Cl. ....................... 174/254; 174/260; 361/749; 439/67; 439/74; 257/738
(58) Field of Search ................................. 174/254, 260; 361/749, 750, 751; 439/67, 74; 257/738

(56) References Cited

U.S. PATENT DOCUMENTS

| | | | |
|---|---|---|---|
| 3,967,162 A | * 6/1976 | Ceresa et al. | 174/68.5 |
| 5,007,842 A | 4/1991 | Deak et al. | |
| 5,035,628 A | * 7/1991 | Casciotti et al. | 439/66 |
| 5,166,773 A | * 11/1992 | Temple et al. | 257/678 |
| 5,273,439 A | * 12/1993 | Szerlip et al. | 439/66 |
| 5,375,041 A | 12/1994 | McMahon | |
| 5,876,215 A | 3/1999 | Biernath et al. | |
| 5,917,709 A | 6/1999 | Johnson et al. | |
| 5,926,369 A | 7/1999 | Ingraham et al. | |
| 5,928,001 A | 7/1999 | Gillette et al. | |
| 5,956,234 A | 9/1999 | Mueller | |
| 5,963,427 A | 10/1999 | Bollesen | |
| 6,061,245 A | 5/2000 | Ingraham et al. | |
| 6,084,778 A | 7/2000 | Malhi | |
| 6,098,282 A | * 8/2000 | Frankeny et al. | 29/852 |
| 6,300,679 B1 | * 10/2001 | Mukerji et al. | 257/686 |

* cited by examiner

Primary Examiner—Kamand Cuneo
Assistant Examiner—Jose' H. Alcala
(74) Attorney, Agent, or Firm—Schwartz & Weinrieb

(57) ABSTRACT

A double-sided circuit card assembly comprises first and second printed wiring boards having first and second sets of electrical contacts mounted thereon, and a signal cross-over interconnect member interposed between the first and second printed wiring boards and bonded thereto so as to form therewith a three-component laminate. The cross-over interconnect member comprises a metal frame member having a slot defined therethrough, and a flex circuit member, having a third set of electrical contacts mounted thereon, is passed through the slot and bent around an internal edge portion of the frame member so as to electrically interconnect the first and second sets of electrical contacts of the first and second printed wiring boards. In this manner, the number of interconnection sites is enhanced, the fabrication of the electrical connections is facilitated, and the flex circuit member is disposed internally of the laminate structure so as not to be exposed to external environmental factors. The frame member also provides the requisite support for the flex circuit, and serves as a heat sink for dissipating heat generated by means of the first and second printed wiring boards.

29 Claims, 1 Drawing Sheet

SIGNAL CROSS-OVER INTERCONNECT FOR A DOUBLE-SIDED CIRCUIT CARD ASSEMBLY

CROSS-REFERENCE TO RELATED PATENT APPLICATIONS

This patent application is related to U.S. Provisional Patent Application Serial No. 60/272,571 which was filed on Mar. 1, 2001 in the name of Stephen G. Gonya.

FIELD OF THE INVENTION

The present invention relates generally to circuit card assemblies, and more particularly to a new and improved signal cross-over interconnect for a double-sided circuit card assembly.

BACKGROUND OF THE INVENTION

A double-sided circuit card assembly, adapted for military or other rugged-environmental usage, comprises a pair of printed wiring boards wherein signal interconnects from a first one of the printed wiring boards disposed upon a first side of the circuit card assembly to the second one of the printed wiring boards disposed upon a second side of the circuit card assembly are conventionally made by means of a flex circuit cross-over which is located upon, or is disposed around, one side edge portion of the double-sided circuit card assembly. More particularly, the end portions of the flex circuit cross-over are soldered to a row of pads located adjacent to an edge portion of each printing wiring board. Backpanel connectors and wedge-locks are normally used upon or dedicate the other edge portions of the circuit card assembly. Consequently, the one side edge portion of the circuit card assembly which is available for the flex circuit signal cross-over interconnects can only provide a limited number of interconnection sites.

In addition, in order for a signal line to be connected from a first one of the printed wiring boards to the second one of the printed wiring boards, the signal line must first be routed to the circuit card assembly edge portion upon which the flex circuit cross-over interconnect is located, and subsequently, the signal line must be routed from the circuit card assembly edge portion, having the flex circuit cross-over interconnect mounted thereon, to the particular or final destination defined upon the second one of the printed wiring boards. This routing of the signal lines to and from the edge portion of the circuit card assembly so as to define every cross-over connection is spatially uneconomical in that such a connection mode consumes or takes up valuable space or routing channels which could otherwise be used for circuit nets or circuit lines. This becomes a significant problem and operative limitation in connection with high-density circuit card assembly designs, systems, or arrays, wherein only a limited number of signal layers are available for routing, or still yet further, in connection with circuit card assembly designs with a relatively large number of circuit nets each of which requires a multiplicity of cross-over interconnect sites. It is also noted that the aforenoted conventional mounting of the flex circuit crossover interconnect upon or around the external edge portion of the circuit card assembly readily exposes the flex circuit cross-over interconnect to external environmental factors and potential damage. Accordingly, the interconnection flex circuit requires suitable provisions to be incorporated into the overall structure of the circuit card assembly in order to protect the external flex circuit cross-over interconnects from such external environmental factors and potential damage. The addition of such protective provisions add significant cost and time constraints to the circuit card assembly manufacturing procedures which further compromises production of such circuit card assemblies in an economical manner.

A need therefore exists in the art for a new and improved signal cross-over interconnect for a double-sided circuit card assembly wherein the structure of each double-sided circuit card assembly would be such that a significant improvement in the number of interconnection sites would be readily achieved, the actual connection of the signal lines between the two printed wiring boards would be significantly simplified, and the disposition of the flex circuit cross-over interconnect would be interposed between the pair of printed wiring boards so as to in effect be disposed internally of the double-sided circuit card assembly such that the flex circuit cross-over interconnect would be inherently protected or shielded from external environmental factors and potential damage whereby the need for auxiliary protection devices would be obviated.

OBJECTS OF THE INVENTION

Accordingly, it is an object of the present invention to provide a new and improved signal cross-over interconnect for a double-sided circuit card assembly.

Another object of the present invention is to provide a new and improved signal cross-over interconnect for a double-sided circuit card assembly which effectively overcomes the various drawbacks and disadvantages characteristic of the PRIOR ART double-sided circuit card assemblies.

An additional object of the present invention is to provide a new and improved signal cross-over interconnect for a double-sided circuit card assembly wherein the number of interconnection sites is significantly enhanced, and the actual connection of the signal lines between the two printed wiring boards is significantly simplified yet still reworkable.

A further object of the present invention is to provide a new and improved signal cross-over interconnect for a double-sided circuit card assembly wherein the disposition of the flex circuit cross-over interconnect is interposed between the pair of printed wiring boards so as to in effect be disposed internally of the double-sided circuit card assembly such that the flex circuit cross-over interconnect is inherently protected or shielded from external environmental factors and potential damage whereby the need for auxiliary protection devices would be obviated.

A last object of the present invention is to provide a new and improved signal cross-over interconnect for a double-sided circuit card assembly wherein the structure of the double-sided circuit card assembly is such that heat dissipation in connection with the pair of printed wiring boards is enhanced, while good mechanical support for the flex circuit cross-over interconnect is likewise provided.

SUMMARY OF THE INVENTION

The foregoing and other objectives are achieved in accordance with the teachings and principles of the present invention through the provision of a new and improved signal cross-over interconnect for a double-sided circuit card assembly which comprises a pair of printed wiring boards and a metal frame member fabricated, for example, from aluminum or a copper alloy, interposed between the two printed wiring boards. The metal frame member has a through-slot defined therein, and an internal edge portion of the frame member which defines the through-slot has a rounded or arcuate configuration such that a flex circuit component, having a plurality of dendritic contact pads mounted upon a substrate portion thereof in a predetermined array, can in effect be wrapped around such internal edge portion of the frame member and bonded to oppositely disposed upper and lower surface portions of the frame member. The dendritic contact pads formed or provided upon the flex circuit component are adapted to be mated with surface-mounted contact pads, formed or provided upon oppositely disposed surfaces of the pair of printed wiring boards, during the bonding operation securing the pair of printed wiring boards to opposite surface portions of the metal frame member, and in this manner, an integral double-sided circuit card assembly having a signal cross-over interconnect is fabricated.

BRIEF DESCRIPTION OF THE DRAWINGS

Various other objects, features, and attendant advantages of the present invention will be more fully appreciated from the following detailed description when considered in connection with the accompanying drawings in which like reference characters designate like or corresponding parts throughout the several views, and wherein.

DETAILED DESCRIPTION OF THE PREFERRED EMBODIMENT

Figure 1:
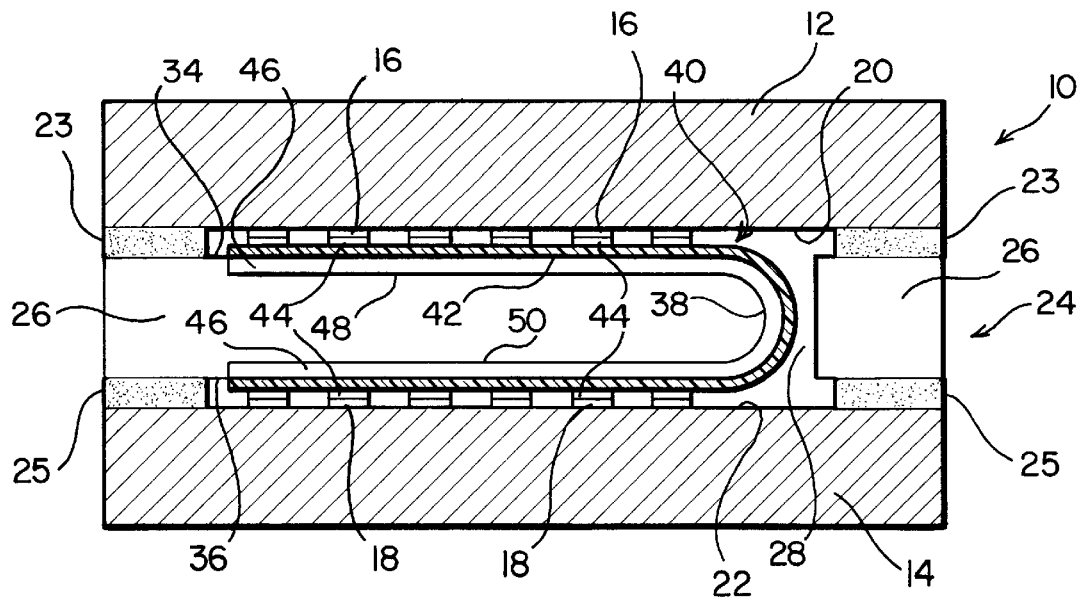
FIG. 1 is a cross-sectional view of a new and improved double-sided circuit card assembly which has a signal cross-over interconnect incorporated therein, which has been constructed in accordance with the teachings and principles of the present invention, and which discloses the cooperative parts thereof.

Referring now to the drawings, and more particularly to FIG. 1 thereof, the new and improved double-sided circuit card assembly, constructed in accordance with the principles and teachings of the present invention, is disclosed therein and is generally indicated by the reference character 10. More particularly, it is seen that the double-sided circuit card assembly 10 comprises first and second printed wiring boards 12 and 14 wherein the first and second printed wiring boards 12 and 14 are adapted to be vertically spaced from each other. Each one of the first and second upper and lower printed wiring boards 12 and 14 is provided with a plurality of surface-mounted contact pads 16,18, respectively, which are arranged within a predetermined array, and it is noted that the surface-mounted contact pads 16,18 are respectively disposed upon the lower and upper surfaces 20,22 of the upper and lower printed wiring boards 12,14 so as to face each other or be disposed opposite each other. In order to provide cross-over interconnect signals between the upper and lower printed wiring boards 12,14, a signal cross-over interconnect component, generally indicated by the reference character 24, is adapted to be interposed between the upper and lower printed wiring boards 12,14, and the upper and lower printed wiring boards 12,14 are adapted to have edge portions of their lower and upper surfaces 20,22 bonded to a frame member 26 of the signal cross-over interconnect component 24 as at 23,25 such that the resulting double sided circuit card assembly 10 comprises, in effect, a three-layer laminate.

Figure 2:
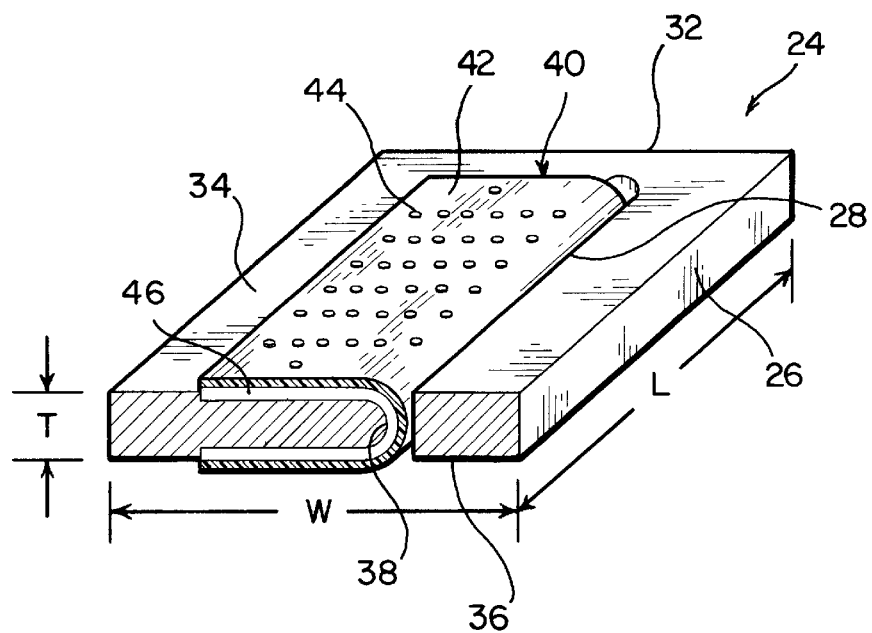
FIG. 2 is a perspective, cross-sectional view of the signal cross-over interconnect component incorporated within the new and improved double-sided circuit card assembly illustrated in FIG. 1, wherein the signal cross-over interconnect component is seen to comprise the metal frame member and the flex circuit component bonded thereto.

More particularly, as best seen with additional reference being made to FIG. 2, the metal frame member 26 of the signal cross-over inter-connect component 24 comprises a substantially planar plate which is defined by means of a predetermined length dimension L, a predetermined width dimension W, and a predetermined depth, height, or thickness dimension T, it of course being appreciated that the particular length, width, and thickness dimensions of the frame member 26 are such as to correspond or be compatible with the dimensions of the upper and lower printed wiring boards 12,14 such that the frame member 26 can in fact be readily incorporated within the aforenoted three-layer laminate structure defining the double sided circuit card assembly 10. Continuing further, it is seen that the frame member 26 further comprises a longitudinally oriented slot 28 which extends from a position adjacent to a front end face, not shown, of the frame member 26 to a terminus which is disposed adjacent to a rear end face 32 of the frame member 26 such that the slot 28 is located at an interior location of the frame member 26, or in other words, is completely enclosed by means of the frame member 26. It is further appreciated that the slot 28 also extends completely through the frame member 28 in the depth or thickness direction from the upper face 34 of the frame member 26 to the lower face 36 of the frame member 26. One of the opposed side walls 38 of the frame member 26 which defines the longitudinal slot 28 is seen to have a rounded or arcuate configuration, and in this manner, such rounded or arcuately shaped frame structure serves to seat a flex circuit member 40 thereon. As a result of the disposition of the slot 28 within an interior portion of the frame member 26, the flex circuit member 40 must be inserted through the slot 28 and then in effect wrapped or bent around the arcuate edge portion or side wall 38.

Flex circuit member 40 comprises a polyamide film or tape substrate 42 having a predetermined copper pattern, not shown, etched thereon. A plurality of contact pads 44 are provided upon the substrate 42 so as to be disposed in a predetermined array as best seen, for example, within FIG. 2 such that the array of flex circuit contact pads 44 corresponds to or matches the aforenoted predetermined arrays of surface-mounted contact pads 16,18 respectively provided upon the upper and lower printed wiring boards 12,14. More particularly, the plurality of contact pads 44 are arranged within a rectangular pad array, and each contact pad 44 would have a maximum diameter of 20 mil such that a 50 mil pitch can be defined between adjacent ones of the contact pads 44. It is additionally noted that the flex circuit tape or film 42 comprises a plurality of contact pads 44 which are provided with dendritic metallizations upon their free surface portions. In this manner, the contact pads 44 create, define, or establish electrical contact with the plurality of surface-mounted pads 16,18 respectively mounted or provided upon the upper and lower printed wiring boards 12, 14 which allows separation of the printed wiring boards 12, 14 from the frame member 26 in order to permit rework operations to be performed upon the various structural components of the double-sided circuit card assembly 10 as necessary. Still further, the flex circuit member 40 further comprises an elastomer backing member 46 which is bonded to the under-surface of the polyamide film or tape substrate 42 and which is likewise adapted to be bonded to the metal frame member 26. The elastomer backing member 46 is provided so as to serve several different functions in connection with the flex circuit member 40 as well as in connection with the signal cross-over interconnect component 24.

More particularly, when the signal cross-over interconnect component 24 is interposed between the upper and lower printed wiring boards 12,14, and the frame member 26 is bonded to boards 12,14 as at 23,25, whereby the dendritic contact pads 44 of the flex circuit member 40 are mated, or engaged in contact, with the surface-mounted contact pads 16,18 of the upper and lower printed wiring boards 12,14, the elastomer backing member 46 electrically insulates or isolates the metal frame member 26 from the flex circuit member 40. In addition, when the dendritic contact pads 44 of the flex circuit member 40 are mated, or engaged in contact, with the surface-mounted contact pads 16, 18 of the upper and lower printed wiring boards 12,14, the elastomer backing member 46, which exhibits a predetermined inherent amount of elasticity and resiliency, biases the dendritic contact pads 44 of the flex circuit member 40 into positive electrical contact or engagement with the surface-mounted contact pads 16,18 of the upper and lower printed wiring boards 12,14. In order to in fact mount and accommodate the disposition and seating of the flex circuit member 40, and in particular, the elastomer backing member 46, upon the metal frame member 26 when the upper and lower printed wiring boards 12,14 and the signal cross-over interconnect component 24 are to be mated together so as to form the aforenoted three-component or three-layer laminate comprising the double sided circuit card assembly 10, upper and lower surface portions 48,50 of the metal frame member 26, as well as the rounded edge portion 38, are effectively respectively recessed.

In this manner, the external surface of the elastomer backing member 46, upon which the flex circuit tape or film 42 is bonded, is in effect able to be disposed in a substantially coplanar manner with respect to those portions of the metal frame member 26 which do not have the flex circuit member 40 mounted thereon, that is, the upper and lower faces 34,36 of the metal frame member 26. In a similar manner, it is further appreciated that the flex circuit tape or film 42, as well as the dendritic contact pads 44 provided thereon, are in effect respectively disposed at elevational levels which are above and below the upper and lower faces 34,36 of the metal frame member 26. As a result of such structure, when upper and lower printed wiring boards 12,14 are to be mated with the signal cross-over interconnect component 24 so as to fabricate, manufacture, or assemble the three-component or three-layer laminate comprising the double sided circuit card assembly 10, the dendritic contact pads 44 upon the flex circuit tape or film 42 will be properly mated or engaged with the surface-mounted contact pads 16,18.

In order to actually fabricate, manufacture, or assemble the three-component or three-layer laminate comprising the double sided circuit card assembly 10, the signal cross-over interconnect component 24 is firstly fabricated, manufactured, or assembled as an integral component or unit. More particularly, the flex circuit member 40, comprising elastomer backing member 46, flex circuit tape or film substrate 42, and the dendritic contact pads 44 mounted thereon, is initially inserted or passed through the slot 28 defined within the metal frame member 26, and subsequently, the flex circuit member 40 is bent around the rounded side wall portion 38 of the metal frame member 26, which partially defines through-slot 28, such that an upper portion of the flex circuit member 40 is seated within the upper recessed surface portion 48 of the metal frame member 26 while a lower portion of the flex circuit member 40 is similarly seated within the lower recessed surface portion 50 of the metal frame member 26. The internal surface portions of the elastomer backing member 46 are then bonded and fixed to the recessed surface portions 48,50 of the metal frame member 26 so as to complete the fabrication, manufacture, and assembly of the signal cross-over interconnect component 24. It is thus further appreciated that as a result of such structural assembly of the signal cross-over interconnect component 24, the metal frame member 26 provides rigid or mechanical support for the flex circuit member 40 whereby not only are the dendritic contact pads 44 maintained in proper contact or engagement with the surface-mounted pads 16,18 of the upper and lower printed wiring boards 12,14 when the frame member 26 of the signal cross-over interconnect component 24 is mated or bonded to the upper and lower printed wiring boards 12,14, but in addition, the structure of the flex circuit member 40 provides both vibrational support and heat dissipation properties to the overall double sided circuit card assembly 10.

Continuing further, when the signal cross-over interconnect component 24 is mated or bonded to the upper and lower printed wiring boards 12,14, opposite edge portions of the printed wiring boards 12,14 are bonded to opposite edge portions of the metal frame member 26 as seen at 23,25 in FIG. 1, and it is noted that such bonding of the printed wiring boards 12,14 to the metal frame member 26 is accomplished through means of a suitable resin or adhesive. The bond line, that is, the thickness dimension of the bonded regions 23,25 comprises a predetermined or controlled thickness value, and it is noted from a manufacturing or fabrication technique point of view that when the edge portions of the pair of upper and lower printed wiring boards 12,14 are bonded to the edge portions of the metal frame member 26, the electrical connections between the dendritic contact pads 44 of the flex circuit member 40 and the surface-mounted contact pads 16,18 of the printed wiring boards 12,14 are simultaneously established. It is to be appreciated still further that as a result of the unique and novel fabricated structure of the double sided circuit card assembly 10 comprising the pair of printed wiring boards 12, 14 and the signal cross-over interconnect component 24 interposed therebetween, the metal frame member 26 of the signal cross-over interconnect component 24 will serve as a heat sink so as to effectively dissipate heat emitted from the pair of printed wiring boards 12,14.

Still yet further, it is to be additionally appreciated that as a result of the unique structure of the signal cross-over interconnect component 24, and as has been noted hereinbefore, there is provided an array of electrical connection sites which readily facilitates the actual connection of the multiplicity of signal lines. In addition, not only does the internal disposition of the signal cross-over interconnect component 24 with respect to the overall structure of the double sided circuit card assembly 10, and in particular, the wrap-around disposition of the flex circuit member 40 through the slot 28 of the metal frame member 26 and the bonding of the same within the recessed regions 48,50 of the metal frame member 26, significantly enhance the number of interconnection sites, but such internal disposition of the signal cross-over interconnect component 24 with respect to the overall structure of the double sided circuit card assembly 10 and between the pair of upper and lower printed wiring boards 12,14 also effectively frees up the external portions of the printed wiring boards 12,14 so as to facilitate full component population of the printed wiring board. Lastly, it is likewise noted that the internal disposition of the of the signal cross-over interconnect component 24 with respect to the overall structure of the double sided circuit card assembly 10 physically shields and protects the signal cross-over interconnect component 24 from environmental factors and potential damage attendant usage of the double sided circuit card assembly 10 whereby provisions for auxiliary protective devices is obviated.

Thus, it may be seen that in accordance with the principles and teachings of the present invention, there has been provided a new and improved double sided circuit card assembly by means of which a multiplicity of contact pads disposed within a predetermined array upon one surface of a first printed wiring board can be electrically connected to a multiplicity of contact pads disposed within a similar predetermined array upon a corresponding surface of a second printed wiring board by means of an internally located flex circuit member which passes through a slot defined within a metal frame member which is interposed between and connected to the first and second printed wiring boards. In this manner, actual electrical connections between the first and second printed wiring boards, through means of the interposed flex circuit member, are facilitated, and in addition, the number of interconection sites is significantly enhanced. In addition, the contact entities provided upon the flex circuit member comprise dendritic contacts which not only serve to establish good electrical contact characteristics with respect to the surface-mounted contacts upon the first and second printed wiring boards, but in addition, such contact interfaces readily permit separation of the established electrical connections for rework operations. Still further, the interdisposition of the solid planar plate metal frame member provides a requisite amount of support for the flex circuit member and the dendritic contact pads mounted thereon whereby good electrical contact between such dendritic contact pads and the surface-mounted pads mounted upon the first and second printed wiring boards is established and maintained, and in addition, the solid metal frame member also provides vibration isolation properties for the overall double sided circuit card assembly. Lastly, the metal frame member also serves as a heat sink member for dissipating heat generated by means of the printed wiring boards and the various components mounted thereon, and the internal disposition of the flex circuit member between the two printed wiring boards serves to protect the various electrical interconnections and connection sites from environmental factors and potential damage which may occur attendant usage of the overall double sided circuit card assembly.

Obviously, many variations and modifications of the present invention are possible in light of the above teachings. It is therefore to be understood that within the scope of the appended claims, the present invention may be practiced otherwise than as specifically described herein.

What is claimed as new and desired to be protected by Letters Patent of the United States of America, is:

1. A double sided circuit card assembly, comprising:
   a first printed wiring board having a first set of electrical contacts mounted thereon;
   a second printed wiring board having a second set of electrical contacts mounted thereon;
   a solid substantially planar plate frame member interposed between said first and second printed wiring boards and having an upper surface portion, a lower surface portion, oppositely disposed edge regions of said upper and lower surface portions, and a slot defined within said solid substantially planar plate frame member at a position interposed between said oppositely disposed edge regions and extending through said solid substantially planar plate frame member from said upper surface portion thereof to said lower surface portion thereof so as to define an internal edge portion between said oppositely disposed edge regions; and
   a flex circuit member disposed through said slot defined within said solid substantially planar plate frame member and bent around said internal edge portion of said solid substantially planar plate frame member and having a third set of electrical contacts mounted upon an external surface thereof for electrical connection to said first and second sets of electrical contacts respectively mounted upon said first and second printed wiring boards for establishing electrical connections between said first and second printed wiring boards.

2. The circuit card assembly as set forth in claim 1, wherein:
   said first printed wiring board has a lower surface portion which is disposed above said upper surface portion of said solid substantially planar plate frame member, and oppositely disposed edge regions of said lower surface portion which are disposed above said oppositely disposed edge regions of said upper surface portion of said solid substantially planar plate frame member;
   said second printed wiring board has an upper surface portion which is disposed below said lower surface portion of said solid substantially planar plate frame member, and oppositely disposed edge regions of said upper surface portion which are disposed below said oppositely disposed edge regions of said lower surface portion of said solid substantially planar plate frame member; and
   means for respectively bonding together said oppositely disposed edge regions of said upper and lower surface portions of said solid substantially planar plate frame member to said oppositely disposed edge regions of said lower surface portion of said first printed wiring board, and to said oppositely disposed edge regions of said upper surface portion of said second printed wiring board,
   whereby said double-sided circuit card assembly comprises a three-component laminate.

3. The circuit card assembly as set forth in claim 2, wherein:
   said flex circuit member is passed through said slot defined within said solid substantially planar plate frame member and bent around said edge portion of said solid substantially planar plate frame member such that an internal surface portion of said flex circuit member is mounted upon said upper and lower surface portions of said solid substantially planar plate frame member.

4. The circuit card assembly as set forth in claim 3, wherein:
   said edge portion of said solid substantially planar plate frame member, around which said flex circuit member is bent, is disposed internally with respect to said oppositely disposed edge regions of said solid substantially planar plate frame member which are bonded to said oppositely disposed edge regions of said first and second printed wiring boards,
   whereby said flex circuit member is protected from external environmental factors.

5. The circuit card assembly as set forth in claim 2, wherein:
   said solid substantially planar plate frame member comprises a metal so as to serve as a heat sink for dissipating heat generated by said first and second printed wiring boards.

6. The circuit card assembly as set forth in claim 1, wherein said flex circuit member comprises:
   a printed circuit substrate upon which said third set of electrical contacts are mounted; and
   an elastomer backing member mounted upon said solid substantially planar plate frame member so as to electrically isolate said flex circuit member from said solid substantially planar plate frame member.

7. The circuit card assembly as set forth in claim 1, wherein said flex circuit member comprises:
   a printed circuit substrate upon which said third set of electrical contacts are mounted; and
   an elastomer backing member mounted upon said solid substantially planar plate frame member for biasing said third set of electrical contacts of said printed circuit substrate into good electrical contact with said first and second sets of electrical contacts mounted upon said first and second printed wiring boards.

8. The circuit card assembly as set forth in claim 7, wherein:
   said printed circuit substrate comprises a polyamide film having a copper circuit pattern etched thereon.

9. The circuit card assembly as set forth in claim 1, wherein:
   said third set of electrical contacts mounted upon said flex circuit member comprises plated dendritic contacts for establishing good electrical connections with said first and second sets of electrical contacts mounted upon said first and second printed wiring boards and for readily permitting separation of said electrical connections in accordance with rework operations.

10. The circuit card assembly as set forth in claim 1, wherein:
    said third set of contacts mounted upon said flex circuit member are arranged within a grid array having a predetermined pitch dimension.

11. A double sided circuit card assembly having a signal cross-over interconnect incorporated therein, comprising:
    a first printed wiring board having a first set of electrical contacts mounted thereon;
    a second printed wiring board having a second set of electrical contacts mounted thereon;
    a solid substantially planar plate frame member interposed between said first and second printed wiring boards and having an upper surface portion, a lower surface portion, oppositely disposed edge regions of said upper and lower surface portions, and a slot defined within said solid substantially planar plate frame member at a position interposed between said oppositely disposed edge regions and extending through said solid substantially planar plate frame member from said upper surface portion thereof to said lower surface portion thereof so as to define an internal edge portion between said oppositely disposed edge regions; and
    a flex circuit member disposed through said slot defined within said solid substantially planar plate frame member and bent around said internal edge portion of said solid substantially planar plate frame member and having a third set of electrical contacts mounted upon an external surface thereof for electrical connection to said first and second sets of electrical contacts respectively mounted upon said first and second printed wiring boards for establishing electrical connections between said first and second printed wiring boards.

12. The circuit card assembly as set forth in claim 11, wherein:
    said first printed wiring board has a lower surface portion which is disposed above said upper surface portion of said solid substantially planar plate frame member, and oppositely disposed edge regions of said lower surface portion which are disposed above said oppositely disposed edge regions of said upper surface portion of said solid substantially planar plate frame member;
    said second printed wiring board has an upper surface portion which is disposed below said lower surface portion of said solid substantially planar plate frame member, and oppositely disposed edge regions of said upper surface portion which are disposed below said oppositely disposed edge regions of said lower surface portion of said solid substantially planar plate frame member; and
    means for respectively bonding together said oppositely disposed edge regions of said upper and lower surface portions of said solid substantially planar plate frame member to said oppositely disposed edge regions of said lower surface portion of said first printed wiring board, and to said oppositely disposed edge regions of said upper surface portion of said second printed wiring board,
    whereby said double-sided circuit card assembly comprises a three-component laminate.

13. The circuit card assembly as set forth in claim 12, wherein:
    said flex circuit member is passed through said slot defined within said solid substantially planar plate frame member and bent around said edge portion of said solid substantially planar plate frame member such that an internal surface portion of said flex circuit member is mounted upon said upper and lower surface portions of said solid substantially planar plate frame member.

14. The circuit card assembly as set forth in claim 13, wherein:
    said edge portion of said solid substantially planar plate frame member, around which said flex circuit member is bent, is disposed internally with respect to said oppositely disposed edge regions of said solid substantially planar plate frame member which are bonded to said oppositely disposed edge regions of said first and second printed wiring boards,
    whereby said flex circuit member is protected from external environmental factors.

15. The circuit card assembly as set forth in claim 12, wherein:
    said solid substantially planar plate frame member comprises a metal so as to serve as a heat sink for dissipating heat generated by said first and second printed wiring boards.

16. The circuit card assembly as set forth in claim 11, wherein said flex circuit member comprises:
    a printed circuit substrate upon which said third set of electrical contacts are mounted; and
    an elastomer backing member mounted upon said solid substantially planar plate frame member so as to electrically isolate said flex circuit member from said solid substantially planar plate frame member.

17. The circuit card assembly as set forth in claim 11, wherein said flex circuit member comprises:
    a printed circuit substrate upon which said third set of electrical contacts are mounted; and an elastomer backing member mounted upon said solid substantially planar plate frame member for biasing said third set of electrical contacts of said printed circuit substrate into good electrical contact with said first and second sets of electrical contacts mounted upon said first and second printed wiring boards.

18. The circuit card assembly as set forth in claim 17, wherein:

said printed circuit substrate comprises a polyamide film having a copper circuit pattern etched thereon.

19. The circuit card assembly as set forth in claim 11, wherein:

said third set of electrical contacts mounted upon said flex circuit member comprises plated dendritic contacts for establishing good electrical connections with said first and second sets of electrical contacts mounted upon said first and second printed wiring boards and for readily permitting separation of said electrical connections in accordance with rework operations.

20. The circuit card assembly as set forth in claim 11, wherein:

said third set of contacts mounted upon said flex circuit member are arranged within a grid array having a predetermined pitch dimension.

21. A signal cross-over interconnect for use within a double sided circuit card assembly comprising first and second printed wiring boards having first and second sets of electrical contacts mounted thereon, comprising:

a solid substantially planar plate frame member adapted to be interposed between the first and second printed wiring boards and having an upper surface portion, a lower surface portion, oppositely disposed edge regions of said upper and lower surface portions, and a slot defined within said solid substantially planar plate frame member at a position interposed between said oppositely disposed edge regions and extending through said solid substantially planar plate frame member from said upper surface portion thereof to said lower surface portion thereof so as to define an internal edge portion between said oppositely disposed edge regions; and a flex circuit member, disposed through said slot defined within said solid substantially planar plate frame member, bent around said internal edge portion of said solid substantially planar plate frame member, and having a set of electrical contacts mounted upon an external surface thereof for electrical connection to the first and second sets of electrical contacts respectively mounted upon the first and second printed wiring boards, for establishing electrical connections between the first and second printed wiring boards.

22. The cross-over interconnect as set forth in claim 21, wherein:

said flex circuit member is passed through said slot defined within said solid substantially planar plate frame member and bent around said edge portion of said solid substantially planar plate frame member such that an internal surface portion of said flex circuit member is mounted upon said upper and lower surface portions of said solid substantially planar plate frame member.

23. The cross-over interconnect as set forth in claim 22, wherein:

said edge portion of said solid substantially planar plate frame member, around which said flex circuit member is bent, is disposed internally with respect to said oppositely disposed edge regions of said solid substantially planar plate frame member which are to be bonded to the first and second printed wiring boards, whereby said flex circuit member is protected from external environmental factors.

24. The cross-over interconnect as set forth in claim 21, wherein:

said solid substantially planar plate frame member comprises a metal so as to serve as a heat sink for dissipating heat generated by the first and second printed wiring boards when said cross-over interconnect is bonded to the first and second printed wiring boards.

25. The cross-over interconnect as set forth in claim 21, wherein said flex circuit member comprises:

a printed circuit substrate upon which said set of electrical contacts are mounted; and an elastomer backing member mounted upon said solid substantially planar plate frame member so as to electrically isolate said flex circuit member from said solid substantially planar plate frame member.

26. The cross-over interconnect as set forth in claim 21, wherein said flex circuit member comprises:

a printed circuit substrate upon which said third set of electrical contacts are mounted; and an elastomer backing member mounted upon said solid substantially planar plate frame member for biasing said set of electrical contacts of said printed circuit substrate into good electrical contact with the first and second sets of electrical contacts mounted upon the first and second printed wiring boards when said cross-over interconnect is bonded to the first and second printed wiring boards.

27. The cross-over interconnect as set forth in claim 25, wherein:

said printed circuit substrate comprises a polyamide film having a copper circuit pattern etched thereon.

28. The cross-over interconnect as set forth in claim 26, wherein:

said set of electrical contacts mounted upon said flex circuit member comprises plated dendritic contacts for establishing good electrical connections with the first and second sets of electrical contacts mounted upon the first and second printed wiring boards and for readily permitting separation of said electrical connections in accordance with rework operations.

29. The cross-over interconnect as set forth in claim 21, wherein:

said set of contacts mounted upon said flex circuit member are arranged within a grid array have a predetermined pitch dimension.

* * * * *